(12) United States Patent
Honda

(10) Patent No.: US 6,380,795 B1
(45) Date of Patent: Apr. 30, 2002

(54) SEMICONDUCTOR INTEGRATED CIRCUIT

(75) Inventor: Takashi Honda, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/576,997

(22) Filed: May 24, 2000

(30) Foreign Application Priority Data

Oct. 6, 1999 (JP) .......................................... 11-285898

(51) Int. Cl.[7] .............................................. H03K 17/687
(52) U.S. Cl. ....................................... 327/434; 327/544
(58) Field of Search ................................ 327/108, 109, 327/110, 111, 112, 589, 77, 143, 544, 434; 326/83, 85, 87, 21, 27, 86

(56) References Cited

U.S. PATENT DOCUMENTS

| | | | | |
|---|---|---|---|---|
| 4,945,267 A | * | 7/1990 | Galbraith | 327/434 |
| 5,412,333 A | * | 5/1995 | Okunaga | 327/198 |
| 5,621,348 A | * | 4/1997 | Furutani et al. | 327/598 |
| 5,920,227 A | * | 7/1999 | An | 327/544 |
| 5,942,809 A | * | 8/1999 | Hashimoto | 327/540 |
| 6,028,474 A | * | 2/2000 | Ito | 327/544 |

* cited by examiner

Primary Examiner—Matthew Smith
Assistant Examiner—Paul Dinh
(74) Attorney, Agent, or Firm—Volentine Francos, PLLC

(57) ABSTRACT

An input circuit is established between an input pad and a first stage input gate; a determining portion and switching portion are established in this input circuit. The determining portion determines the presence of bonding to an input pad according to the potential of the input pad. The switching portion outputs a low level signal to the first stage input gate when the determining portion determines that "there is no bonding" and connects the first stage input gate with the input pad when the determining portion determines that "there is bonding".

7 Claims, 2 Drawing Sheets

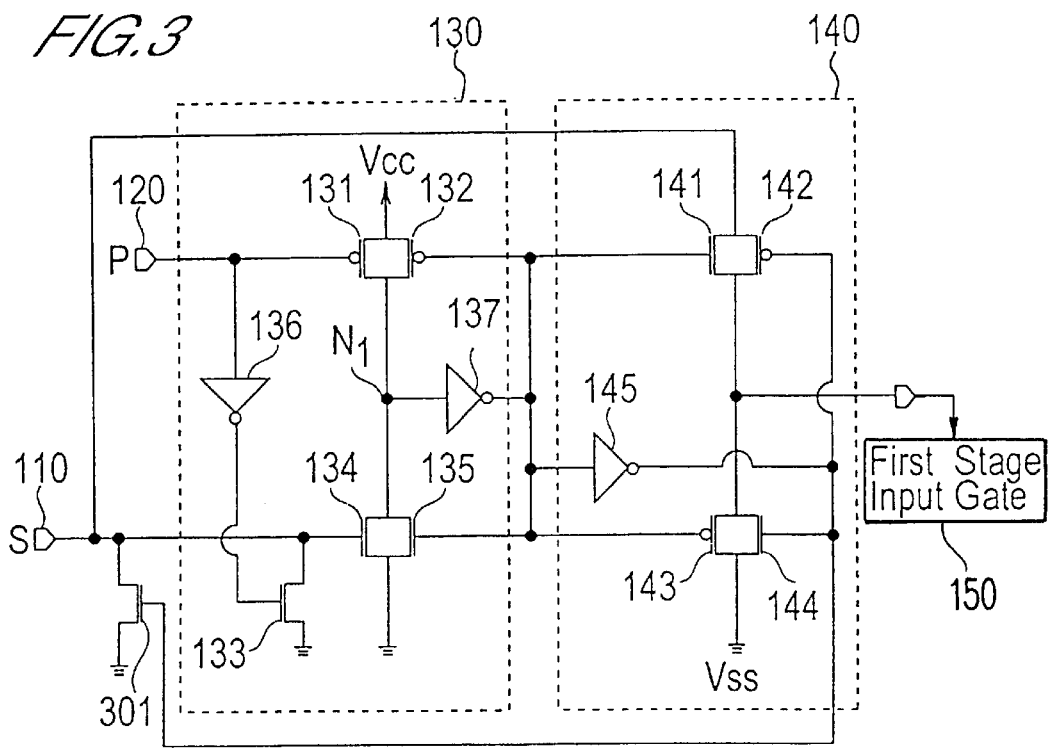
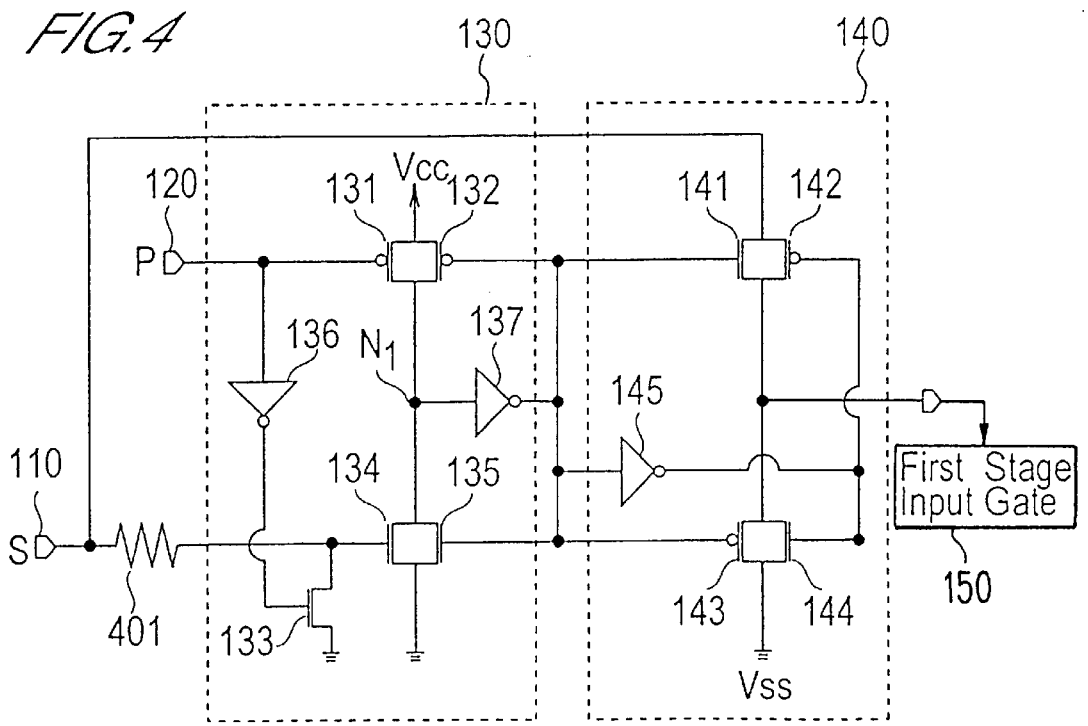

SEMICONDUCTOR INTEGRATED CIRCUIT

BACKGROUND OF THE INVENTION

1. Field of the Invention

The present invention relates to a semiconductor integrated circuit.

This application is a counterpart application of Japanese application Serial Number 285898/1999, filed Oct. 6, 1999, the subject matter of which is incorporated herein by reference.

2. Description of Related Art

In the development of semiconductor integrated circuits, part of a circuit is sometimes common to different types of integrated circuits. Development costs can be reduced and development time shortened by having parts of the circuits in common.

In the case where part of an integrated circuit is made common, unused pads are sometimes formed within the integrated circuits.

For example, we will consider the case of two types of integrated circuits A and B, where three types of control signals $S_1$, $S_2$, and $S_3$ must be input from outside to the integrated circuit A, but only control signals $S_1$ and $S_2$ need be input from outside to the integrated circuit B and the control signal $S_3$ is not used thereby.

In such a case, when these integrated circuits A and B have common portions, pads $P_1$, $P_2$, and $P_3$ for inputting control signals $S_1$, $S_2$, and $S_3$ are formed in each integrated circuit A and B. Pads $P_1$, $P_2$, and $P_3$ are all used in integrated circuit A, but only pads $P_1$ and $P_2$ are used in integrated circuit B and pad $P_3$ is not used thereby.

When unused input pads are present in a conventional semiconductor integrated circuit, these unused input pads must be set to a prescribed potential. In a conventional semiconductor integrated circuit, wires or the like are therefore bonded to unused input pads as well as to used pads and potentials such as $V_{CC}$ and $V_{SS}$ are supplied thereto. The potential must be fixed because, when the potential of unused input pads is not fixed, the varying potential of the input pads due to minority carriers or the like may be handled within the integrated circuit as an input signal and cause erroneous operation of the integrated circuit.

Moreover, it is desirable that the number of pads to be bonded be reduced in view of reducing manufacturing costs for semiconductor devices and improving yields.

From this perspective, a technique for eliminating the need for the bonding of unused input pads is desirable.

SUMMARY OF THE INVENTION

It is an object of the present invention to provide a semiconductor integrated circuit that does not require the potential of unused input pads to be held at an externally supplied potential.

In order to achieve this object, the semiconductor integrated circuit relating to the present invention is provided the unique constitution described below. Specifically, the semiconductor integrated circuit relating to the present invention is provided an input circuit between an input pad and first stage input gate. In the present invention, this input circuit comprises a determining portion to determine the presence of bonding at an input pad according to the potential of that input pad, and a switching portion to output a first level potential to the first stage input gate when the determining portion determines that "there is no bonding" and to connect the input pad to the first stage input gate when the determining portion determines that "there is bonding".

In a semiconductor integrated circuit relating to the present invention, the determining portion checks for bonding and the switching portion sets the potential level of the first stage input gate in the case there is no bonding. Consequently, it is not necessary to perform bonding because it is not necessary to fix the potential of the unused input pads with an externally supplied potential.

BRIEF DESCRIPTION OF THE DRAWINGS

The foregoing and other objects, feature and advantageous of the present invention will be better understood from the following description taken in connection with the following drawings, in which:

FIG. 3 is a circuit diagram of the semiconductor integrated circuit relating to the second embodiment; and FIG. 4 is a circuit diagram of the semiconductor integrated circuit relating to the third embodiment.

DESCRIPTION OF THE PREFERRED EMBODIMENTS

Figure 1:
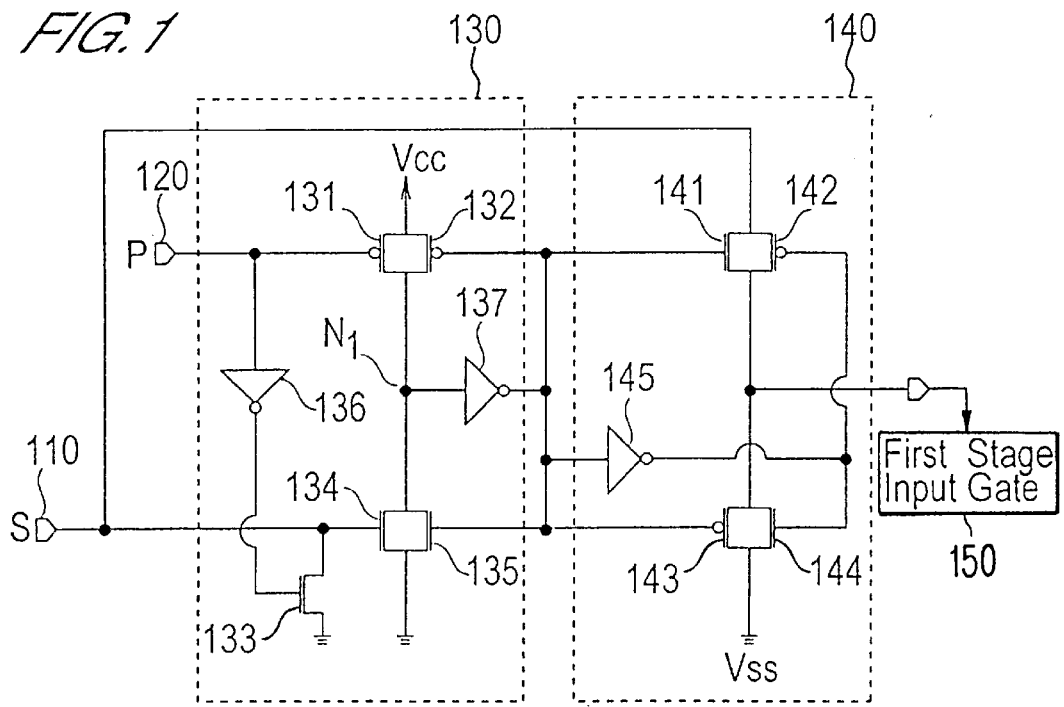
FIG. 1 is a circuit diagram of the semiconductor integrated circuit relating to the first embodiment.

The preferred embodiments of the present invention are explained below using the drawings. In the drawings, the sizes, forms, and relative positions of the constitutional elements are only to provide an outline for understanding the present invention and the numerical conditions explained. below are merely for illustration.

First Embodiment

A semiconductor integrated circuit relating to the first embodiment is explained using FIGS. 1 and 2.

FIG. 1 is a circuit diagram showing the elements constituting the semiconductor integrated circuit relating to the first embodiment.

As shown in FIG. 1, the semiconductor integrated circuit relating to the present embodiment comprises an input pad 110, a pad 120 for the initialization reset signal, determining portion 130, and switching portion 140. The determining portion 130 and switching portion 140 constitute the input circuit of the present invention. The output potential of the switching portion 140 is supplied by a first stage input gate 150.

The input pad 110 is the pad for inputting the signal S, such as a control signal, from outside the circuit. This input pad 110 is used when such a signal S is necessary to the operation of the semiconductor integrated circuit. When the input pad 110 is used, a wire or the like is bonded to the input pad 110. Meanwhile, when the signal S is not necessary this input pad 110 is not used and bonding is not performed.

The pad 120 for the initialization reset signal is the pad to input an initialization reset signal P. The initialization reset signal P is a reset signal for initializing the entire integrated circuit when power is applied to the semiconductor device and is used even in conventional, general purpose semiconductor integrated circuits. As discussed below, the initialization reset signal P used in the present embodiment becomes low level directly after power is applied and becomes high level after a prescribed time has passed since power was applied.

The determining portion 130 determines whether there is bonding to the input pad 110 depending on the potential of the input pad 110. The determining portion 130 in the present embodiment comprises five MOS transistors 131~135 and two inverters 136 and 137. As shown in FIG. 1, the first transistor 131 is a pMOS transistor; the gate electrode is connected to the pad 120 for the initialization reset signal and the source electrode is connected to the power source $V_{CC}$. The second transistor 132 is a pMOS transistor; the gate electrode is connected to the drain electrode of the first transistor 131 via the second inverter 137 and the source electrode is connected to the power source $V_{CC}$, and the drain electrode is connected to the drain electrode of the first transistor 131. The third transistor 133 is an nMOS transistor; the gate electrode is connected to the pad 120 for the initialization reset signal via the first inverter 136, the source electrode is connected to the power source $V_{SS}$, and the drain electrode is connected to the input pad 110. The fourth transistor 134 is an nMOS transistor; the gate electrode is connected to an input pad 110, the source electrode is connected to the power source $V_{SS}$, and the drain electrode is connected to the drain electrodes of the first and second transistors 131 and 132. The fifth transistor 135 is an nMOS transistor; the gate electrode is connected to the output pin of the second inverter 137, the source electrode is connected to the voltage source $V_{SS}$, and the drain electrode is connected to the drain electrodes of the first and second transistors 131 and 132.

Here, the driving capacity of the first transistor 131 is preferably greater than the driving capacity of the fifth transistor 135 for the reasons discussed below. The driving capacity of the fourth transistor 134 is preferably greater than the driving capacity of the second transistor 132 for the reasons discussed below.

The switching portion 140 outputs a low level potential to the first stage input gate when the determining portion 130 determines "there is no bonding" and connects the first stage input gate and the input pad 110 when the determining portion 130 determines that "there is bonding". The switching portion 140 relating to the present embodiment comprises four MOS transistors 141~144 and an inverter 145. As shown in FIG. 1, the sixth transistor 141 is an nMOS transistor; the gate electrode is connected to the output pin of the second inverter 137, the source electrode is connected to the first stage input gate, and the drain electrode is connected to the input pad 110. The seventh transistor 142 is a pMOS transistor; the gate electrode is connected to the output pin of the second inverter 137 via the third inverter 145, the source electrode is connected to the input pad 110, and the drain electrode is connected to the drain electrode of the sixth transistor 141. The eighth transistor 143 is a pMOS transistor; the gate electrode is connected to the output pin of the second inverter 137, the source electrode is connected to the first stage input gate, and the drain electrode is connected to the power source $V_{SS}$. The ninth transistor 144 is an nMOS transistor; the gate electrode is connected to the output pin of the third inverter 145, the source electrode is connected to the power source $V_{SS}$, and the drain electrode is connected to the source electrode of the eighth transistor 143.

Next, the operation of the semiconductor integrated circuit shown in FIG. 1 is explained using the timing chart in FIG. 2.

Figure 2A:
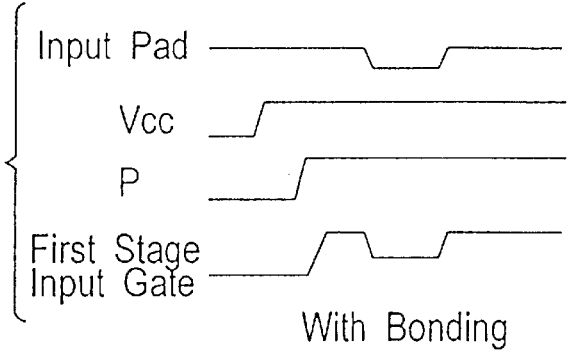
FIG. 2 (including FIGS. 2A and 2B) shows timing charts for explaining the operation of the semiconductor integrated circuit shown in FIG. 1.

The operation when the input pad 110 is bonded is explained using the timing chart in FIG. 2A.

As discussed above, the initialization reset signal P becomes low level directly after power is applied and becomes high level after the passage of a prescribed time from when power was applied. The input to the first inverter 136 therefore becomes low level directly after power is applied, so the gate potential of the third transistor 133 becomes high level. The third transistor 133 consequently becomes ON. The gate potential of the fourth transistor 134 thereby becomes low level even when the input pad 110 is high level; as a result, the fourth transistor 134 becomes OFF.

Also, the first transistor 131 is ON because the initialization reset signal P is low level. For this reason, the node $N_1$ becomes high level due to the source potential $V_{CC}$ and consequently, the output potential of the second inverter 137 becomes low level. The output potential of the second inverter 137 is sent as the output signal of the determining portion 130 to the switching portion 140. Moreover, because the output of the second inverter 137 becomes low level, the second transistor 132 is turned ON and the fifth transistor 135 is turned OFF.

The output signal of the determining portion 130 is input to the sixth transistor 141, eighth transistor 143, and third inverter 145 within the switching portion 140. Here, the output signal of the determining portion 130 is low level, so the sixth transistor 141 is OFF and the eighth transistor 143 is ON. Furthermore, because the output potential of the third inverter 145 becomes high level, the seventh transistor 142 is turned OFF and the ninth transistor 144 is turned ON. Consequently, the source potential $V_{SS}$ is supplied to the first stage input gate via the eighth transistor 143 and the ninth transistor 144. In other words, the output signal of the switching portion 140 becomes low level.

After the passage of a prescribed time since power was applied, the initialization reset signal P becomes high level. Accordingly, the first transistor 131 is turned OFF and the first inverter 136 outputs low level, so the third transistor 133 is turned OFF as well.

At this time, the input signal of the input pad 110 is high level (see FIG. 2A), so the fourth transistor 134 is turned ON by the OFF operation of the third transistor 133.

Here, the timing for turning ON the fourth transistor 134 is preferably faster than the timing for turning OFF the second transistor 132 in order to cause the node $N_1$ to change quickly from high level to low level when the initialization reset signal P changes from low level to high level. Consequently, the driving capacity of the fourth transistor 134 is preferably greater than the driving capacity of the second transistor 132.

When the second inverter 137 becomes high level, the sixth transistor 141 in the switching portion 140 is turned ON and the eighth transistor 143 is turned OFF. Furthermore, the seventh transistor 142 is turned ON and the ninth transistor 144 is turned OFF because the output potential of the third inverter 145 becomes low level. The first stage input gate is thereby disconnected from the power source $V_{SS}$ and connected to the input pad 110. Consequently, the input signal of the input pad 110 is supplied to the first stage input gate without any processing. Specifically, as shown in FIG. 2A, when the potential of the input pad 110 is high level, the input potential of the first stage input gate also becomes high level; and when the potential of the input pad 110 becomes low level, the input potential of the first stage input gate also changes to low level.

The initialization reset signal P is maintained at a high level until power is applied once more. Consequently, the state wherein the input pad 110 is connected to the first stage input gate is also maintained until power is applied once more.

Moreover, the fifth transistor 135 is turned ON in the case where the output potential of the second inverter 137 is high level when power is applied. The driving capacity of the first transistor 131 is preferably greater than the driving capacity of the fifth transistor 135 in order that the node $N_1$ quickly becomes high level when the first transistor 131 is ON with the device in this state.

Figure 2B:
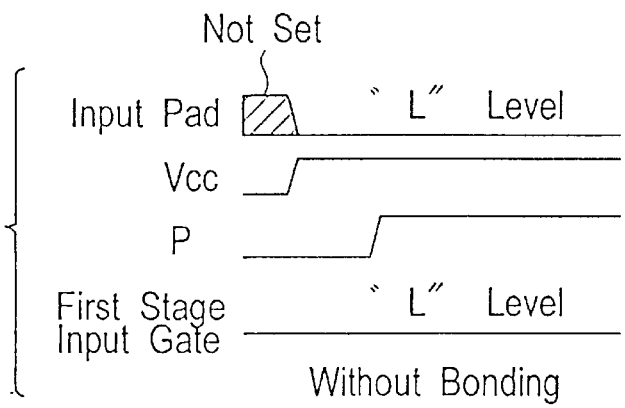

Next the operation in the case where there is no bonding to the input pad 110 is explained using the timing chart in FIG. 2B.

Directly after power is applied, the output of the first inverter 136 becomes high level because the initialization reset signal P becomes low level. The third transistor 133 consequently becomes ON. Because the gate potential of the fourth transistor 134 thereby becomes low level regardless of the potential of the input pad 110, the fourth transistor 134 is turned OFF. The input pad 110 also becomes low level due to the third transistor 133 being turned ON.

Furthermore, because the first transistor 131 is turned ON and makes node $N_1$ high level like in the abovementioned case, the output potential of the second inverter 137 becomes low level and consequently the second transistor 132 is turned ON and the fifth transistor 135 becomes OFF. For this reason, in the switching portion 140, the sixth transistor 141 and seventh transistor 142 are turned OFF and the eighth transistor 143 and ninth transistor 144 are turned ON, like in the abovementioned case. Consequently, the source potential $V_{SS}$ is supplied to the first stage input gate via the eighth transistor 143 and ninth transistor 144.

After the passage of a prescribed time from when power was applied, the initialization reset signal P becomes high level. Accordingly, the first transistor 131 is turned OFF and the output of the first inverter 136 is low level; the third transistor 133 is therefore also OFF. At this time, the fourth transistor 134 is maintained in an OFF state because the potential of the input pad 110 is low level. Also, the second transistor 132 is maintained in an ON state and the fifth transistor 135 is maintained in an OFF state. Consequently, because the node $N_1$ is maintained at a high level, the output of the second inverter 137, specifically the output of the determining portion 130, is maintained at a low level. Consequently, the output of the switching portion 140, specifically the input of the first stage input gate, is also maintained at a low level.

The initialization reset signal P is maintained at a high level until power is applied once more. Consequently, the input to the first stage input gate is set to a low level until power is applied once more.

In this way, the determining portion 130 determines the presence of bonding in the semiconductor integrated circuit relating to the present embodiment. Then, when bonding is present, the switching portion 140 connects the input pad 110 and the first stage input gate. On the other hand, when bonding is not present, the switching portion 140 sets the potential of the first stage input gate to $V_{SS}$. In the semiconductor integrated circuit relating to the present embodiment, it is therefore not necessary to set the potential of an unused input pad to a potential supplied from outside the circuit and consequently it is not necessary to perform bonding.

In the present embodiment, the case where the potential of the first stage input gate is set to $V_{SS}$ when the input pad 110 is not bonded was explained. In such a case, however, it is also possible to constitute the input circuit so that the potential of the first stage input gate is set to $V_{CC}$. In this case, the p- and n-type classification of the first through ninth transistors is completely opposite to the circuit shown in FIG. 1. The source $V_{SS}$ may be connected to the transistor to which the source $V_{CC}$ is connected in the circuit in FIG. 1 and the source $V_{CC}$ may be connected to the transistor to which the source $V_{SS}$ is connected in the circuit in FIG. 1.

Second Embodiment

The semiconductor integrated circuit relating to the second embodiment is explained using FIG. 3.

FIG. 3 is a circuit diagram showing the elements constituting the semiconductor integrated circuit relating to the present embodiment.

In FIG. 3, the elements with the same call-outs as in FIG. 1 each show the same elements as in FIG. 1.

The semiconductor integrated circuit relating to the present embodiment is different from the semiconductor integrated circuit in the first embodiment discussed above with respect to comprising a tenth transistor 301.

As shown in FIG. 3, the tenth transistor 301 is an nMOS transistor; the gate electrode is connected to the output pin of the third inverter 145, the source electrode is connected to the source $V_{SS}$, and the drain electrode is connected to the input pad 110. Here, it is preferable to use a transistor with a low driving capacity as the tenth transistor 301. Specifically, it is preferable to use as the tenth transistor 301 a transistor with a driving capacity such that the minority carrier accumulated within the input pad 110 flows to the source $V_{SS}$ once the tenth transistor 301 is turned ON when the potential of the input pad 110 is low level, but the input pad 110 is maintained at a high level even when the tenth transistor 301 is turned ON when the potential of the input pad 110 is high level. The following explanation concerns the case where such a low driving capacity transistor is used as the tenth transistor 301.

Next, the operation of the semiconductor integrated circuit shown in FIG. 3 is explained.

The operation in the case of bonding to the input pad 110 is explained next.

As in the case of the first embodiment, the initialization reset signal P becomes low level directly after power is applied. Consequently, the input circuit in FIG. 3 also operates the same as the input circuit in the first embodiment and supplies low level potential to the first stage input gate. The input potential of the input pad 110 becomes high level (see FIG. 2A). At this time, the tenth transistor 301 is turned ON because the output potential of the third inverter 145 becomes high level. However, the potential of the input pad 110 remains high level even when the tenth transistor 301 is ON because a transistor with a low driving capacity is used as the tenth transistor 301 as discussed above.

Thereafter, when the initialization reset signal P becomes high level after a prescribed period of time has passed since power was applied, the input pad 110 and first stage input gate are connected with the same operation as the first embodiment. At this time, the tenth transistor 301 is turned OFF because the output potential of the third inverter 145 becomes low level.

Next, the operation in the case of no bonding to the input pad 110 is explained.

When the initialization reset signal P becomes low level with the application of power, low level potential is supplied to the first stage input gate like the case discussed above. The input potential of the input pad 110 becomes low level (see FIG. 2B). At this time, the tenth transistor 301 is turned ON because the output potential of the third inverter 145 becomes high level. Accordingly, even if a minority carrier accumulates within the input pad 110, the minority carrier flows to the source $V_{SS}$.

After that, the initialization reset signal P becomes high level after the passage of a prescribed period of time from when power was applied, but the potential supplied to the first stage input gate is maintained at a low level with the same operation as in the first embodiment. At this time, the tenth transistor 301 is maintained in an ON state because the output potential of the third inverter 145 is also maintained at the high level. Consequently, the minority carrier accumulated in the input pad 110 flows to the source $V_{SS}$.

In this way, in the semiconductor integrated circuit relating to the present embodiment, setting the tenth transistor 301 can prevent accumulation of minority carrier in the input pad 110 in the case of no bonding of the input pad 110. Consequently, with the present embodiment, it is possible to prevent the minority carrier from raising the potential of the input pad 110 and causing erroneous operation of the input circuit.

Also, when a transistor with a small driving capacity is used as the tenth transistor 301 as discussed above, the potential does not drop when the input pad 110 is high level; the input circuit can therefore be caused to operate entirely as in the case of the first embodiment.

The present embodiment is the same as the first embodiment with regards to bonding to unused input pads being unnecessary, and with regards to the possibility of constituting the input circuit so that the potential of the first stage input gate is set to $V_{CC}$.

Third Embodiment

The semiconductor integrated circuit relating to the third embodiment of the present invention is explained using FIG. 4.

FIG. 4 is a circuit diagram showing the elements constituting the semiconductor integrated circuit relating to the present embodiment.

In FIG. 4, the elements with the same call-outs as in FIG. 1 each show the same elements as in FIG. 1.

The semiconductor integrated circuit relating to the present embodiment differs from the abovementioned semiconductor integrated circuit relating to the first embodiment with regards to establishing a resistor 401 between the input pad 110 and the drain of the third transistor 133.

The entire operation of the semiconductor integrated circuit relating to the present embodiment is the same as that of the first embodiment and an explanation thereof is therefore omitted.

As explained in the first embodiment, directly after power is applied, the initialization reset signal P becomes low level, the third transistor 133 becomes ON, and a high level signal is input to the input pad 110 (see FIG. 2A). Consequently, current flows from the input pad 110 to the source $V_{SS}$ via the third transistor 133.

In the present embodiment, the current consumed by the semiconductor integrated circuit can be reduced because this current is controlled using the resistor 401.

The present embodiment is the same as the first embodiment with regards to bonding to unused input pads being unnecessary, and with regards to the possibility of constituting the input circuit so that the potential of the first stage input gate is set to $V_{CC}$.

As explained in detail above, the semiconductor integrated circuit relating to the present invention makes bonding unnecessary because it is not necessary to set the potential of unused input pads with an externally supplied potential.

What is claimed is:

1. A semiconductor integrated circuit having an input circuit between an input pad and a first stage input gate, the input circuit comprising:
    a determining portion that determines a presence of bonding at said input pad according to a potential of said input pad; and
    a switching portion that disconnects the input pad from said first stage input gate and outputs a first level potential to said first stage input gate when said determining portion determines that there is no bonding at said input pad, and that connects said input pad to said first stage input gate when said determining portion determines that there is bonding at said input pad.

2. The semiconductor integrated circuit, according to claim 1, wherein said determining portion comprises:
    a first transistor of a first conductive type connected at an initialization pad to an initialization reset signal that is a first level of potential directly after power is applied and that is a second level of potential after a prescribed time has passed since power was applied, a first main electrode of said first transistor is connected to a first power source that supplies said first level of potential;
    a second transistor of the first conductive type having a control electrode connected to a second main electrode of said first transistor via a second inverter, a first main electrode connected to said first power source, and a second main electrode connected to said second main electrode of said first transistor;
    a third transistor of a second conductive type having a control electrode connected to the initialization pad via a first inverter, a first main electrode connected to a second power source that supplies said second level of potential, and a second main electrode connected to said input pad;
    a fourth transistor of the second conductive type having a control electrode connected to said input pad, a first main electrode connected to said second power source, and a second main electrode connected to said second main electrodes of said first and second transistors; and
    a fifth transistor of the second conductive type having a control electrode connected to an output of said second inverter, a first main electrode connected to said second power source, and a second main electrode connected to said second main electrodes of said first and second transistors.

3. The semiconductor integrated circuit, according to claim 2, further comprising a sixth transistor of the second conductive type, having a control electrode connected to a third inverter, a first main electrode connected to said second source, and a second main electrode connected to said input pad.

4. The semiconductor integrated circuit according to claim 3, wherein said switching portion comprises:
    a seventh transistor of the second conductive type having a control electrode connected to the output of said second inverter, a first main electrode connected to said first stage input gate, and a second main electrode connected to said input pad;
    an eighth transistor of the first conductive type having a control electrode connected to the output of said second inverter via said third inverter, a first main electrode connected to said input pad, and a second main electrode connected to said second main electrode of said seventh transistor;

a ninth transistor of the first conductive type having a control electrode connected to the output of said second inverter, a first main electrode connected to said first stage input gate, and a second main electrode connected to said second source; and a tenth transistor of the second conductive type having a control electrode connected to an output of said third inverter, a first main electrode connected to said second source, and a second main electrode connected to said first main electrode of said ninth transistor.

5. The semiconductor integrated circuit, according to claim 2, further comprising a resistor connected between said input pad and said second main electrode of said third transistor.

6. The semiconductor integrated circuit according to claim 5, wherein said switching portion comprises:

a sixth transistor of the second conductive type having a control electrode connected to the output of said second inverter, a first main electrode connected to said first stage input gate; and said second main electrode connected to said input pad;

a seventh transistor of the first conductive type having a control electrode connected to the output of said second inverter via a third inverter, a first main electrode connected to said input pad, and a second main electrode connected to said second main electrode of said sixth transistor;

an eighth transistor of the first conductive type having a control electrode connected to the output of said second inverter, a first main electrode connected to said first stage input gate, and a second main electrode connected to said second source; and a ninth transistor of the second conductive type having a control electrode connected to an output of said third inverter, a first main electrode connected to said second source, and a second main electrode connected to said first main electrode of said eighth transistor.

7. The semiconductor integrated circuit according to claim 2, wherein said switching portion comprises:

a sixth transistor of the second conductive type having a control electrode connected to the output of said second inverter, a first main electrode connected to said first stage input gate, and a second main electrode connected to said input pad;

a seventh transistor of the first conductive type having a control electrode connected to the output of said second inverter via a third inverter, a first main electrode connected to said input pad, and a second main electrode connected to said second main electrode of said sixth transistor;

an eighth transistor of the first conductive type having a control electrode connected to the output of said second inverter, a first main electrode connected to said first stage input gate, and a second main electrode connected to said second source; and a ninth transistor of the second conductive type having a control electrode connected to an output of said third inverter, a first main electrode connected to said second source, and a second main electrode connected to said first main electrode of said eighth transistor.

* * * * *